(12) United States Patent
Kato

(10) Patent No.: US 8,842,353 B2
(45) Date of Patent: Sep. 23, 2014

(54) MICROSTRUCTURE AND METHOD OF MANUFACTURING THE SAME

(75) Inventor: Takahisa Kato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 397 days.

(21) Appl. No.: 13/047,670

(22) Filed: Mar. 14, 2011

(65) Prior Publication Data

US 2011/0228372 A1    Sep. 22, 2011

(30) Foreign Application Priority Data

Mar. 16, 2010 (JP) ................. 2010-058726

(51) Int. Cl.
*G02B 26/08* (2006.01)
*B81B 3/00* (2006.01)

(52) U.S. Cl.
CPC ....... *G02B 26/0841* (2013.01); *B81B 2201/038* (2013.01); *B81B 3/0037* (2013.01); *B81B 2203/0163* (2013.01); *G02B 26/085* (2013.01); *B81B 2203/053* (2013.01); *Y10S 359/904* (2013.01)
USPC ........................................ 359/224.1; 359/904

(58) Field of Classification Search
CPC ............. G02B 26/0841; G02B 26/105; G02B 26/085; G02B 26/0833
USPC .......... 359/198.1–199.4, 200.6–200.8, 202.1, 359/221.2, 223.1–225.1, 226.2, 904, 359/290–295, 838, 846, 871, 872; 250/204, 250/559.06, 559.29, 230, 234; 347/255–260; 353/39, 98–99; 385/15–18, 22; 398/12, 19, 45
See application file for complete search history.

(56) References Cited

U.S. PATENT DOCUMENTS

2008/0291524 A1* 11/2008 Ishil et al. ..................... 359/290
2009/0067033 A1    3/2009 Kajino et al.
2009/0080046 A1    3/2009 Ogikubo

FOREIGN PATENT DOCUMENTS

| JP | 07-287177 A | 10/1995 |
| JP | 2002-189176 A | 7/2002 |
| JP | 2007-248731 A | 9/2007 |
| JP | 2008-116669 A | 5/2008 |
| WO | 2005/102909 A1 | 11/2005 |

* cited by examiner

*Primary Examiner* — Jennifer L. Doak
(74) *Attorney, Agent, or Firm* — Canon USA Inc IP Division

(57) ABSTRACT

A microstructure includes a substrate, a fixed supporting portion fixed to the substrate, a first movable portion, a second movable portion enhancing the rigidity of the first movable portion, and an elastic supporting portion elastically interconnecting the first movable portion and the fixed supporting portion. The second movable portion is secured to the first movable portion with a gap interposed therebetween and in such a manner as to cover the elastic supporting portion and the fixed supporting portion. The first movable portion and the second movable portion are elastically supported by the elastic supporting portion in such a manner as to be displaceable together relative to the fixed supporting portion.

13 Claims, 9 Drawing Sheets

MICROSTRUCTURE AND METHOD OF MANUFACTURING THE SAME

BACKGROUND OF THE INVENTION

1. Field of the Invention

The present invention relates to microstructures, such as microelectromechanical systems (MEMS), manufactured from wafers by semiconductor manufacturing processes; microstructure arrays each including a plurality of the same; and methods of manufacturing the same, and in particular to a technique of forming, on a substrate, a structure including a movable portion. Basically, microstructures are of microscopic sizes in, for example, micrometer order, and include movable portions. Microstructures are applicable to dynamic quantity sensors (acceleration sensors, pressure sensors, gyroscopic sensors, and the like), optical deflectors, optical switches, optical modulators, and the like.

2. Description of the Related Art

Hitherto, microelectromechanical systems (MEMS) have been in use as actuators, sensors, and the like (as disclosed in U.S. Patent Application Publication No. 2009/0067033 A1 and Japanese Patent Laid-Open No. 2007-248731). For example, a movable portion is provided on a substrate, and the substrate and the movable portion in combination form a variable capacitor in which the capacitance is variable. Such a capacitor can function as an electrostatic actuator or a sensor that detects any change of capacitance. In another case, a device in which a microstructure is provided on a substrate having an integrated circuit. A microstructure in such a device is utilized as, for example, an optical deflector that deflects light. In yet another case, a plurality of microstructures are provided in the form of an array. In particular, a MEMS device that two-dimensionally deflects light with a plurality of microstructures each including a movable portion having a reflective surface can function as an optical switch, a spatial intensity modulator, a phase modulator, or the like.

In general, a microstructure including a movable portion provided on a substrate has low rigidity and is easy to undergo unintentional deformation. Unintentional deformation is caused by stresses produced in manufacturing individual elements, internal stresses acting inside the elements due to change of temperature, an inertial force under the movable portion's own weight occurring when the movable portion is displaced, external forces, or the like. Particularly, there has been a problem in that it is not easy to prevent unintentional deformation while reducing the spring constant of an elastic supporting portion, in the direction of designed displacement, that supports the movable portion allowing the movement of the movable portion.

SUMMARY OF THE INVENTION

In light of the above, an aspect of the present invention provides a microstructure including a substrate, a fixed supporting portion fixed to the substrate, a first movable portion, a second movable portion, and an elastic supporting portion elastically interconnecting the first movable portion and the fixed supporting portion. The second movable portion is secured to the first movable portion. The first movable portion and the second movable portion are elastically supported by the elastic supporting portion in such a manner as to be displaceable together relative to the fixed supporting portion.

In the microstructure according to the above aspect of the present invention, the rigidity of a structure including the first movable portion is adjustable with the second movable portion. Therefore, the occurrence of unintentional deformation is suppressed while the designed displacement of the movable portions is facilitated.

Further features of the present invention will become apparent from the following description of exemplary embodiments with reference to the attached drawings.

DESCRIPTION OF THE EMBODIMENTS

The microstructure according to the present invention includes a two-layer movable body including a first movable portion and a second movable portion, the movable body as a whole being elastically supported by an elastic supporting portion in such a manner as to be displaceable relative to a fixed supporting portion. The second movable portion can function as a reinforcement that enhances the rigidity, and the rigidity of a structure that includes the first movable portion is therefore adjustable. Thus, the occurrence of unintentional deformation is suppressed while designed displacement is facilitated. The elastic supporting portion and the movable portions are not limited to those described in the following embodiments and examples and may be configured in various other ways. For example, the elastic supporting portion may include a torsion spring that supports the first movable portion such that the first movable portion is capable of undergoing torsional displacement about one axis of torsion relative to the fixed supporting portion. This is a variation of a configuration shown in FIGS. 1A to 1D and is obtained by replacing elastically deformable portions 5 with torsion springs, the torsion springs alone forming the elastic supporting portion. Another exemplary configuration is a variation of the configuration shown in FIGS. 1A to 1D or a configuration shown in FIGS. 3A to 3D and is obtained by exchanging the places between the first movable portion and the fixed supporting portion. Specifically, the first movable portion having, for example, a rectangular or circular shape may be elastically supported in such a manner as to be displaceable inside the fixed supporting portion having a frame-like shape. In such a case, it is easy to realize a configuration in which no elements prevent the displacement of the second movable portion, and the second movable portion may be fixed to the first movable portion with adhesive or the like with no gap interposed therebetween.

Embodiments and examples of the present invention will now be described with reference to the attached drawings.

First Embodiment

Figure 1A:
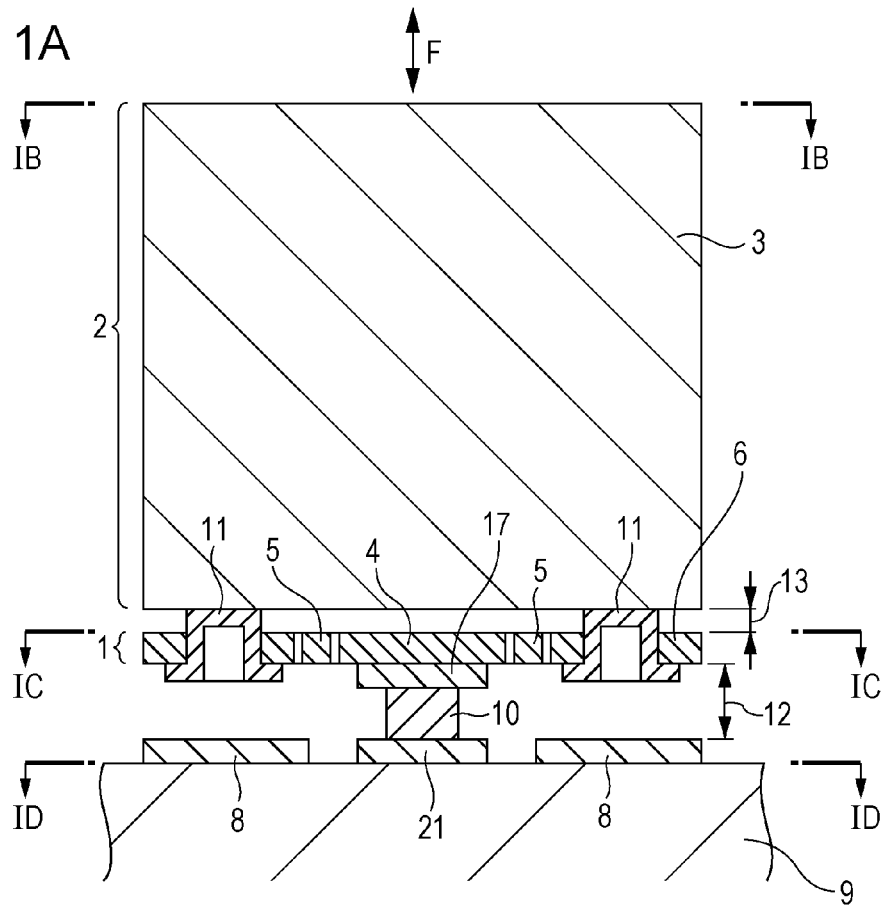
FIGS. 1A to 1D explain an embodiment of the microstructure according to the present invention.
Figure 1B:
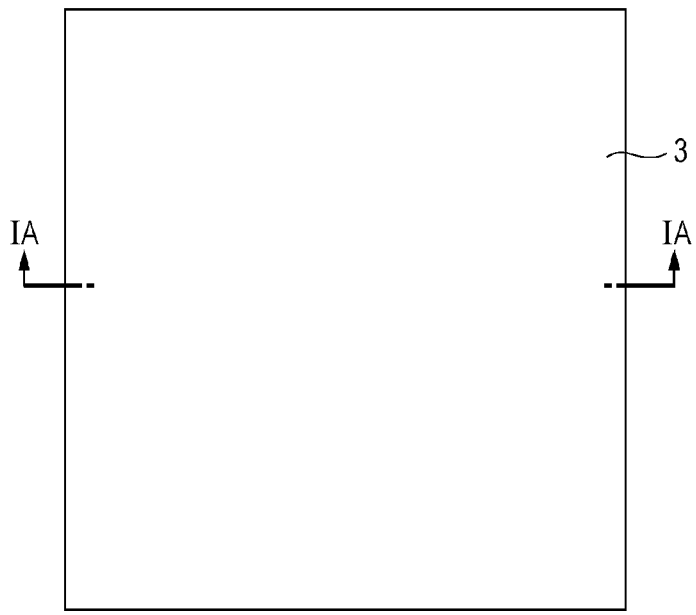
Figure 1C:
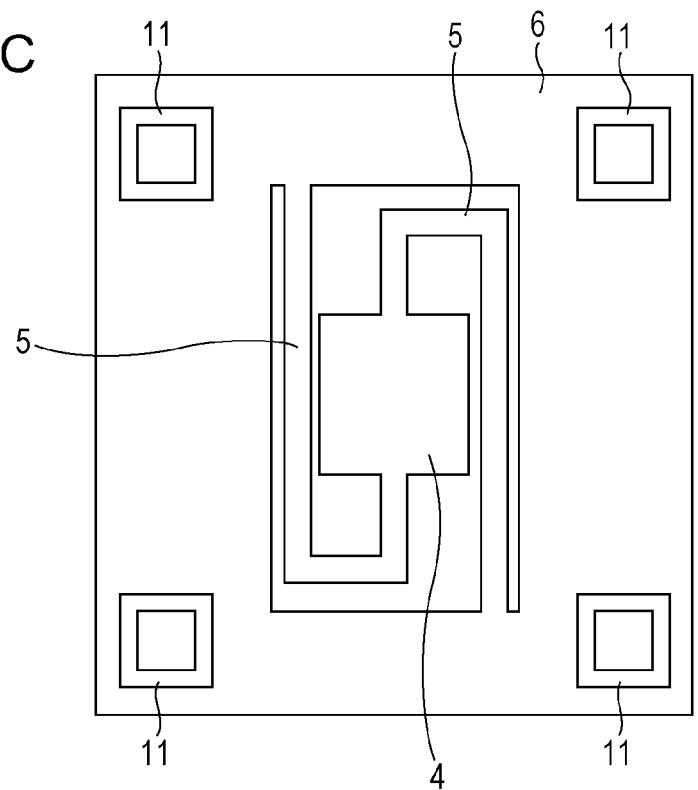
Figure 1D:
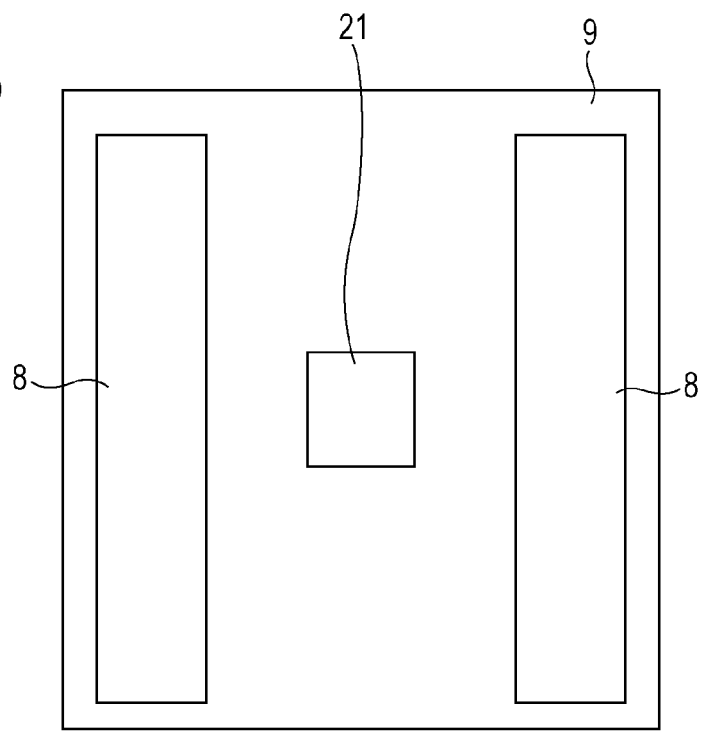

Referring to FIGS. 1A to 1D, a first embodiment of the microstructure according to the present invention will be described. FIG. 1A is a vertical sectional view of a microstructure according to the first embodiment. FIGS. 1B to 1D are horizontal sectional views of the microstructure taken along lines IB-IB, IC-IC, and ID-ID, respectively, in FIG. 1A, corresponding to top views of a second movable portion 3, a structure including a first movable portion 6, and a substrate 9 having fixed electrodes 8, respectively. The vertical section shown in FIG. 1A is taken along line IA-IA shown in FIG. 1B.

Referring to FIG. 1A, the microstructure according to the first embodiment includes the substrate 9, the structure including the first movable portion 6, and the second movable portion 3, with a first gap 12 and a second gap 13 interposed thereamong. The second movable portion 3 functions as a reinforcement that enhances the rigidity of the structure including the first movable portion 6, and is incomparably thicker than the first movable portion 6. Referring to FIG. 1C, the structure including the first movable portion 6 further includes a fixed supporting portion 4 and elastically deformable portions 5. The elastically deformable portions 5, as elastic supporting portions, are capable of undergoing elastic flexural deformation and elastically interconnect the fixed supporting portion 4 and the first movable portion 6 having a frame-like shape surrounding the fixed supporting portion 4. Thus, the elastically deformable portions 5 elastically support the first movable portion 6 such that the first movable portion 6 is movable relative to the fixed supporting portion 4. An underlayer 21 provided on the substrate 9 and the fixed supporting portion 4 are secured to each other with a combination of a columnar connecting portion 10 and a connecting-portion-receiving portion 17. The first movable portion 6 and the second movable portion 3 are secured to each other, as shown in the drawings, with a plurality of coupling portions 11 providing the second gap 13 between the first and second movable portions 6 and 3. Thus, the first and second movable portions 6 and 3 are displaceable together. Referring to FIG. 1D, the substrate 9 has the fixed electrodes 8.

In the first embodiment, the first movable portion 6 and the second movable portion 3 are formed from a device layer and a handle layer, respectively, included in a silicon-on-insulator (SOI) substrate, as described below, and are both single-crystal silicon. The first movable portion 6 is doped with impurities and has a low electrical resistance. The underlayer 21, the connecting portion 10, and the connecting-portion-receiving portion 17 are made of conductive materials. When a voltage is placed on the underlayer 21, the first movable portion 6 is given substantially the same potential as the underlayer 21. Hence, the first movable portion 6 facing the fixed electrodes 8 with the first gap 12 interposed therebetween functions as a movable electrode. Thus, a variable capacitor is formed. When a voltage is placed between the movable electrode 6 and the fixed electrodes 8, an electrostatic force is generated therebetween. Hence, the variable capacitor can function as an electrostatic actuator in which the first movable portion 6 and the second movable portion 3 secured to each other are displaceable. The fixed electrodes 8, which are planar electrodes as shown in the drawings, provided on the substrate 9 may be replaced with a planar coil, and the first movable portion 6, as the movable electrode, may be replaced with a magnetic body such as a nickel member. Such a configuration forms an electromagnetic actuator in which an electromagnetic force is generated between the planar coil and the magnetic body when a current is supplied to the coil. The places of the magnetic body and the planar coil may be exchanged with each other, with the magnetic body being on the substrate 9 and the planar coil being on the side of the first movable portion 6.

In the first embodiment, the elastically deformable portions 5 elastically supports the first movable portion 6 such that the first movable portion 6 is capable of undergoing translational displacement relative to the fixed supporting portion 4 in the direction of the normal to the surface of the page showing FIG. 1C. The second movable portion 3 secured to the first movable portion 6 follows the displacement of the first movable portion 6. The presence of the second gap 13 allows the first movable portion 6 to be displaced without mechanically interfering with any other elements. Thus, the first movable portion 6 and the second movable portion 3 can undergo translational displacement together in direction F shown in FIG. 1A.

Benefits brought by the first embodiment will now be described in detail with reference to the drawings.

First, in the microstructure according to the first embodiment, the structure including the first movable portion 6 is highly rigid. Therefore, while the structure is easy to undergo designed displacement, the amount of unintentional displacement is reduced. Such a configuration is realized by the two-layer structure having the gap 13 (the two-layer structure including the first movable portion 6 and the second movable portion 3 for rigidity enhancement). Thus, variations and change in the effective gap 12 of the capacitor are reduced. Moreover, since the single-crystal-silicon structure has a high Young's modulus and a low density, deformation occurring at the application of an acceleration is small. In addition, since the second movable portion 3 reinforces and supports the first movable portion 6 provided in the layer having the elastically deformable portions 5, the rigidity of the structure is enhanced, regardless of the spring constant of the elastically deformable portions 5.

The above benefit will further be described. The microstructure undergoes displacement in the designed direction because of the presence of the elastically deformable portions 5. By reducing the spring constant of the elastically deformable portions 5, the microstructure becomes easier to undergo displacement in the designed direction. To reduce the spring constant of the elastically deformable portions 5, the width of the elastically deformable portions 5, shown in FIG. 1C, may be reduced; the length of the elastically deformable portions 5 may be increased; or the thickness of the first movable portion 6 may be reduced. The length of the elastically deformable portions 5 refers to the dimension of a virtual center line of each elastically deformable portion 5 extending between the fixed supporting portion 4 and the first movable portion 6, and the width of the elastically deformable portions 5 refers to the dimension in a direction perpendicular to the center line. To reduce the spring constant only by changing the width or the length, however, the following problems arise. As the width is reduced, the processing accuracy is correspondingly reduced. That is, as the ratio of the thickness to the width (the aspect ratio of the cross section) is increased in processing the elastically deformable portions 5, the width-processing accuracy in the thickness direction is lowered. Consequently, a problem arises in that the range of variations in the spring constant is widened. In contrast, if the length of the elastically deformable portions 5 is increased, the total area of the microstructure is increased, and the number of microstructures that can be obtained from a single wafer in the manufacturing process, which will be described below, is reduced. The area of the first movable portion 6 may be reduced while the total area of the microstructure is unchanged. In such a case, however, since the area of the movable electrode is reduced, the range in which the capacitance of the capacitor can be varied is narrowed. If such a structure is applied to an electrostatic actuator, the driving voltage is increased. If such a structure is applied to an electromagnetic actuator, the areas provided for the planar coil and the magnetic body are reduced, and the driving current is increased.

Hence, to realize a microstructure that is easy to undergo displacement in the designed direction, it is effective to reduce the thickness of the elastically deformable portions 5, i.e., elastic supporting portions, as well as adjusting the width and length of the elastically deformable portions 5. In the microstructure according to the first embodiment including the second movable portion 3 and the second gap 13, even if the thickness of the elastically deformable portions 5 is reduced, the rigidity of the structure as a whole is maintained to be high while the displacement of the elastically deformable portions 5 is not prevented. Thus, a configuration that is easy to undergo displacement in the designed direction but is hard to undergo unintentional deformation is realized. Moreover, by designing the first movable portion 6 and the elastically deformable portions 5 to have the same thickness, a structure including the two can be obtained by etching a single-layer member. Since the first movable portion 6 and the elastically deformable portions 5 are provided as an integral body, enhanced strength is provided to portions connecting the first movable portion 6 and the elastically deformable portions 5 to which large stresses of deformation are applied when the microstructure undergoes displacement. Moreover, since the first movable portion 6 and the elastically deformable portions 5 are obtained by one etching process, the manufacturing process is simplified.

There are three major factors that are considered to cause unintentional deformation of the microstructure that is driven for use: acceleration at driving, internal stress in individual elements, and external force. In the first embodiment, all kinds of deformation due to the foregoing three factors are either reduced or prevented from occurring. First, deformation due to acceleration at driving will be described. When the microstructure shown in FIG. 1A undergoes displacement, an acceleration is applied thereto, whereby the first movable portion 6 and the second movable portion 3 are subjected to inertial forces under their own weights. If the first movable portion 6 is deformed significantly with the inertial force, the length of the first gap 12 has variations, i.e., a distribution, producing errors in the capacitance of the capacitor. In the case of an electrostatic actuator, such errors correspond to errors in the driving voltage. If the deformation becomes more significant, a so-called pull-in displacement in which the movable electrode undergoes displacement until it lands on the fixed electrodes 8 may occur at an unintentional level of voltage. In the case of an electromagnetic actuator also, the distance between the coil and the magnetic body has variations if the first movable portion 6 is deformed, producing errors in the driving current. Meanwhile, the inertial force is smaller in areas where the weight is lighter. Furthermore, deformation due to inertial force is smaller for higher rigidity. Hence, if a structure is made of a material having a low density and a high Young's modulus, deformation due to inertial force is small, although the shape of the structure is unchanged. Since the microstructure according to the first embodiment is made of single-crystal silicon having a low density and a high Young's modulus, deformation due to inertial force that may occur along with the displacement of the microstructure is reduced.

Next, deformation due to internal stress in individual elements will be described. It is in general known that, in a microstructure provided on a substrate, stresses remaining in individual elements significantly deform the microstructure itself. Such deformation occurs particularly because of gradients in stress acting in the direction of thickness of a single-material thin-film structure or differences in stress between different films of a multi-layer thin-film structure. The microstructure according to the first embodiment is basically made of single-crystal silicon in which substantially no internal stress is produced in the manufacturing process. Therefore, deformation due to internal stress is reduced. Moreover, since both layers of the two-layer structure including the first and second movable portions 6 and 3, respectively, are made of single-crystal silicon, there is substantially no difference in the amount of expansion due to residual stress and temperature change occurring during the manufacturing process. Hence, there occurs substantially no internal stress due to temperature change and the like, and deformation due to internal stress is therefore reduced. Meanwhile, since the second movable portion 3 does not require any actuator mechanism, such as an electrode; a magnet; or coil, for generating a force, the second movable portion 3 does not include a plurality of layers of different materials. Accordingly, deformation due to residual stress and deformation due to difference in the coefficient of thermal expansion are reduced. In addition, since no heat is generated at the generation of a force, deformation due to difference in the coefficient of thermal expansion is further reduced.

Lastly, deformation due to external force will be described. When a microstructure is subjected to a force from the outside, portions thereof having lower rigidity deform more significantly. In the microstructure according to the first embodiment, the second movable portion 3 having a high rigidity maintains the rigidity of the first movable portion 6 to be high. This reduces the deformation of the first movable portion 6 due to external force. Thus, the occurrence of unintentional deformation due to a force generated between the first movable portion 6 and the substrate 9 is suppressed. Consequently, errors in the driving voltage or current for causing an intended displacement are reduced. With the presence of the gap 13, the movable portions 6 and 3 can undergo displacement although the elastically deformable portions 5 are provided directly below the second movable portion 3. In such an arrangement, since the microstructure has a reduced area, a plurality of microstructures can be provided at a high packing density, and the manufacturing cost is correspondingly reduced.

There is another possibility that the elastically deformable portions 5 and so forth that have fine structures and low rigidity may be damaged by an external force produced at any impact or contact of some foreign object thereinto during the manufacturing process or during use. In the first embodiment, the elastically deformable portions 5 are provided directly below the second movable portion 3 provided for reinforcement as described above, that is, the second movable portion 3 covers the elastically deformable portions 5. This prevents the elastically deformable portions 5 from being deformed or damaged at the impact or contact of any foreign object. Meanwhile, the first and second gaps 12 and 13 define the maximum amount of displacement of the elastically deformable portions 5, preventing the elastically deformable portions 5 from being displaced more than the maximum amount. That is, with either of the first and second gaps 12 and 13, a situation is produced where an element of the microstructure comes into contact with another element before the elastically deformable portions 5 are damaged, whereby displacement further than that point of contact is prevented. In FIG. 1A, the fixed supporting portion 4 and the second movable portion 3 come into contact with each other before the elastically deformable portions 5 are damaged. Thus, the probability of damaging the elastically deformable portions 5 is reduced. The probability of damaging the elastically deformable portions 5 may alternatively be reduced by causing the first movable portion 6 and the substrate 9 or the coupling portions 11 and the fixed electrodes 8 to come into contact with each other. Particularly in the case of contact between the coupling portions 11 and the fixed electrodes 8, since only the coupling portions 11 come into contact with the fixed electrodes 8, the total area of contact is small, and adhesion therebetween that may occur after the contact is therefore suppressed.

A second benefit brought by the first embodiment is that manufacturing errors of the first gap 12 that determines the generative force and the like of the actuator are reduced. This is realized by reducing the deformation of the first movable portion 6 and by making the first movable portion 6 from single-crystal silicon having a smooth surface. As described above, the first movable portion 6 of the microstructure according to the first embodiment is hard to deform. Therefore, in the case of use as an electrostatic actuator, the effective gap 12 of the capacitor is prevented from being changed by any bend in the first movable portion 6, i.e., the movable electrode. Since manufacturing errors and change of the gap 12 are thus reduced, a capacitor having a small gap can be obtained. That is, in the case of use as an electrostatic actuator, if the surface roughness of the electrodes of a parallel-plate capacitor is large, the effective gap of the capacitor is small. Nonuniform surface roughness leads to variations in the gap of the capacitor. If the electrodes have such surface irregularities, the electric field tends to be intensified at projecting portions of the irregularities, and unintentional discharge may occur. In this respect, in the first embodiment, the movable electrode is provided in the surface of the first movable portion 6. The surface of the first movable portion 6 is obtained as a surface of a single-crystal-silicon device layer of an SOI substrate, as described below, providing a smooth homogeneous surface with small roughness. Hence, manufacturing errors of the effective gap of the capacitor are reduced, and the occurrence of short circuits due to discharge is suppressed. In a case where an insulating layer is formed over the movable electrode, variations in the thickness of the insulating layer on the electrode are reduced, whereby variations in withstand voltage are reduced. In the case of use as an electromagnetic actuator, the positional deviation of the magnetic body or the planar coil provided on the first movable portion 6 due to bending of the first movable portion 6 is prevented. That is, since the structure as a whole is hard to undergo unintentional deformation, the distance between the coil and the magnetic body is prevented from changing along with bending of the movable portion due to a residual stress in the coil or the magnetic body or a difference in the coefficient of thermal expansion between the movable portion and the coil or the magnetic body. Hence, an electromagnetic actuator in which the coil and the magnetic body are closely provided is realized.

A third benefit brought by the first embodiment is that the microstructure has high stability in displacement repeatability and in long-term use. This is realized with the elastically deformable portions 5 made of single-crystal silicon. Single-crystal silicon exhibits an ideally linear elastic characteristic over a wide stress range. Moreover, single-crystal silicon does not cause phenomena that are seen for many metal materials, specifically, hardening after repeated deformation, or relieving of a deforming stress in a relatively long time. Therefore, the aforementioned stability is improved with the elastically deformable portions 5 made of single-crystal silicon. In addition, since the fixed supporting portion 4, the elastically deformable portions 5, and the first movable portion 6 are provided as an integral body formed from a single layer, the strength of fixation at connections thereamong is enhanced while manufacturing errors in the strength of fixation are reduced. Consequently, variations in the driving voltage are reduced. In a case where the first movable portion 6 is resonantly driven, the Q factor of resonance is increased.

A fourth benefit brought by the first embodiment is that the occurrence of mechanical interference between the first movable portion 6 and the second movable portion 3 is suppressed. This is realized by securing the movable portions 6 and 3 to each other and thus allowing the two to undergo displacement together in the same direction. As shown in FIGS. 1A to 1D, the first movable portion 6 that directly receives the generative force of the actuator is secured to the second movable portion 3 with the coupling portions 11 interposed therebetween. Hence, even if a large displacement occurs, there is substantially no difference between the individual displacements of the movable portions 6 and 3. Therefore, the probability of mechanical interference therebetween is small, despite the small second gap 13. Such a configuration is easy to manufacture.

A fifth benefit brought by the microstructure according to the first embodiment is that, since the first movable portion 6 is secured to one fixed supporting portion 4, the elastically deformable portions 5, as elastic supporting portions, are not affected by the stress from the substrate 9. That is, the elastically deformable portions 5 are prevented from expanding or contracting when any difference occurs in the amount of expansion between the substrate 9 and the first movable portion 6 because of the difference in the coefficient of thermal expansion therebetween or when any deformation occurs by securing the substrate 9 to another member. Thus, among various factors that may change the spring constant of the elastic supporting portion and so forth, substantially all factors relating to a stress applied from the substrate 9 to the elastic supporting portion are eliminated. Therefore, changes of the spring constant and so forth are suppressed. Accordingly, in a case of a large-scale array also, changes of the spring constant and so forth between different microstructures due to the foregoing stress are suppressed. That is, variations in the spring constant and so forth and the change with time are reduced. This effect particularly works well in the case of a large-area array in which the temperature in the array and the deformation of the electrode substrate tend to have distributions. Thus, accuracy in the displacement angle of each of the microstructures is improved, and the accurate angle is maintained for a longer time. Furthermore, since changes of the spring constant and so forth are small, a circuit and method for driving a large-scale array are simplified. Consequently, in the case where the substrate 9 has a driving circuit, the number of wires that control the electrodes included in the array is reduced.

Second Embodiment

A second embodiment concerning a method of manufacturing the microstructure according to the first embodiment of the present invention will now be described with reference to FIGS. 2A to 2F. FIGS. 2A to 2F show steps of manufacturing a plurality of microstructures in sectional view corresponding to FIG. 1A. First, referring to FIG. 2A, an SOI substrate is prepared. The SOI substrate includes a first layer 25, an insulating layer 16, and a second layer 26. The first layer 25 and the second layer 26 are made of single-crystal silicon. Supposing that the microstructure according to the first embodiment of the present invention is manufactured in the following process, the first layer 25 is to become a plurality of second movable portions 3, and the second layer 26 is to become a plurality of structures each including a first movable portion 6 and so forth. In the second embodiment, the second layer 26 has a thickness of 1.5 μm, and the first layer 25 has a thickness of 525 μm. The dimensions of the microstructure according to the present invention are not limited to the foregoing and may be other dimensions.

Figure 2A:
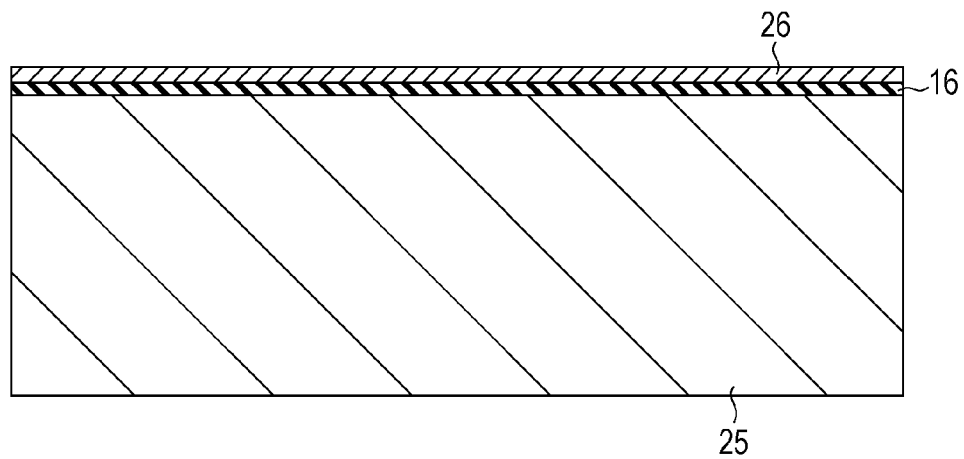
FIGS. 2A to 2F explain an embodiment of the method of manufacturing a microstructure according to the present invention.
Figure 2B:
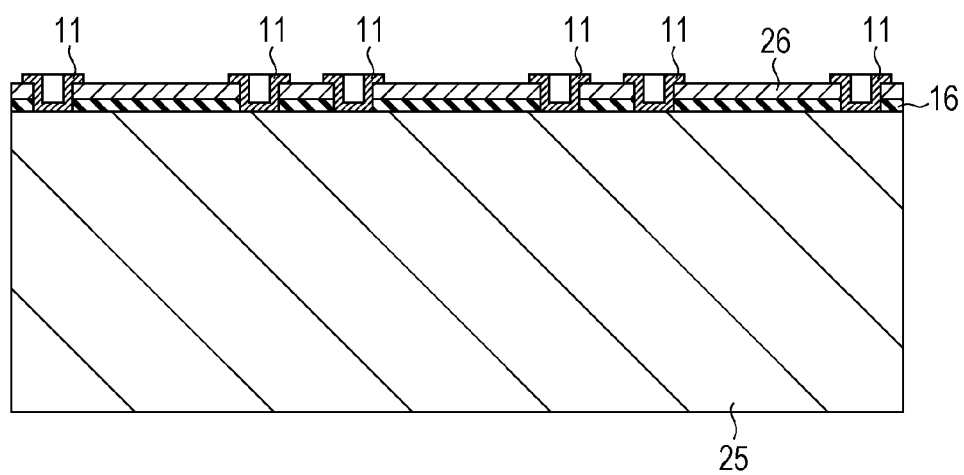
Figure 2C:
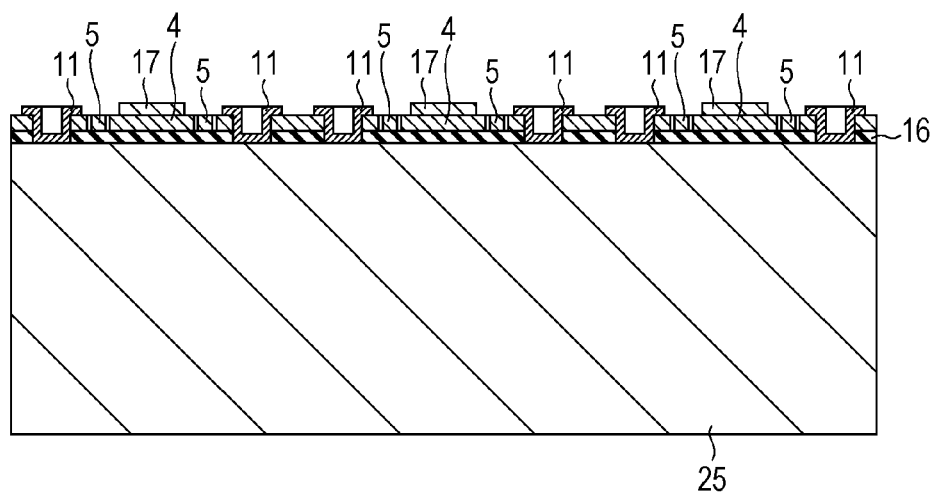

Referring now to FIG. 2B, coupling portions 11 are formed in the second layer 26. Specifically, a pattern of through-holes is first provided in the second layer 26 by photolithography and silicon dry etching. Subsequently, the through-holes are continued so as to extend through the insulating layer 16 lying under the second layer 26. Furthermore, a material that is to become coupling portions 11 is deposited in the through-holes. In the second embodiment, a silicon nitride film is deposited by low-pressure chemical vapor deposition (LPCVD). After the deposition, the film are patterned into coupling portions 11, as shown in FIG. 2B, by photolithography and dry etching. The material for the coupling portions 11 is not limited to a silicon nitride film and may be any other material, such as tungsten; polycrystalline silicon; or the like, that cannot be etched in a subsequent step of removing the insulating layer 16, which is a sacrifice layer. Subsequently, referring to FIG. 2C, elastically deformable portions 5, as elastic supporting portions, are formed in the second layer 26. Specifically, a material that is to become connecting-portion-receiving portions 17 is first deposited and is patterned as follows. In the second embodiment, after a resist pattern is formed, chromium, palladium, and gold are sequentially deposited and then lift-off is performed. In the second embodiment, reference marks (not shown) for alignment to be performed in a subsequent bonding step are also formed in the this step. Subsequently, portions of the second layer 26 are patterned into elastically deformable portions 5 by photolithography and silicon dry etching. In the second embodiment, fixed supporting portions 4 are also formed in this step. In the second embodiment, each of the fixed supporting portions 4 is of side 40 μm, and each of the elastically deformable portions 5 is of width 3 μm. Subsequently, while the elements provided on the side of the second layer 26 are protected, the first layer 25 is subjected to chemical mechanical polishing (CMP) so as to have a reduced thickness of 100 μm.

Figure 2D:
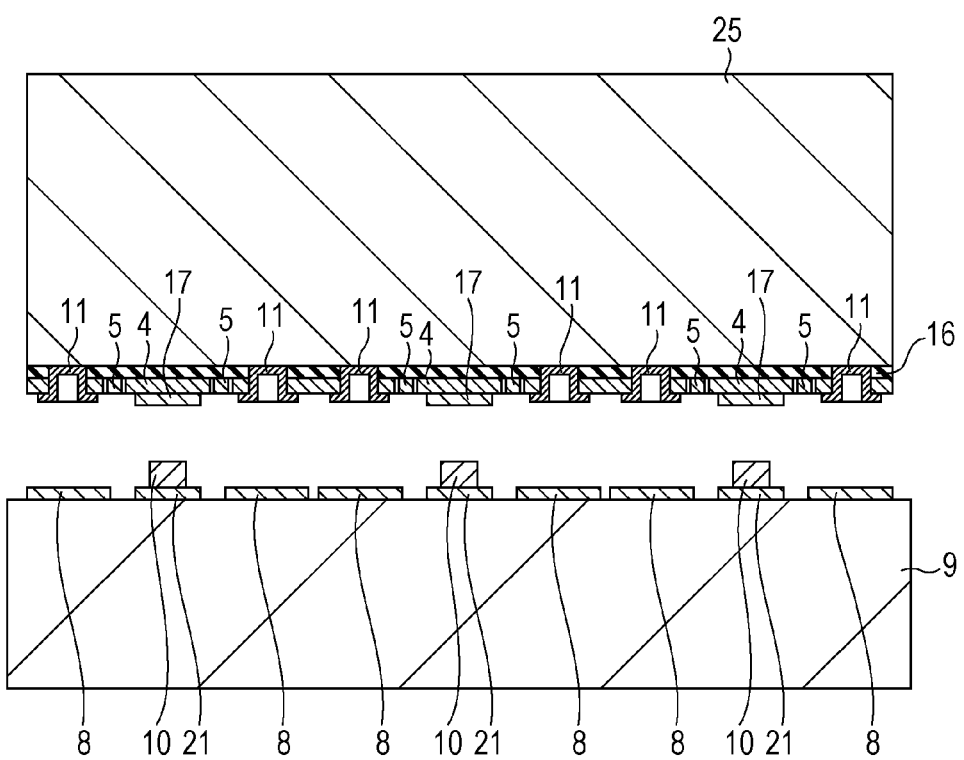

Referring now to FIG. 2D, a substrate 9 is prepared and is aligned with the above SOI substrate so as to be bonded thereto. In the second embodiment, the substrate 9 is formed of a silicon wafer on which a film that is to become fixed electrodes 8 each including layers of chromium; palladium; and gold, and a film that is to become underlayers 21 are deposited and patterned. Simultaneously with the formation of the fixed electrodes 8, reference marks (not shown) for alignment to be performed in subsequent steps of bonding and separation are also formed. Subsequently, connecting portions 10 are formed on the underlayers 21. In the second embodiment, bumps 10, as shown in FIG. 2D, are formed by photolithography and electrogilding. The bumps 10 are each a square column having a base of side 19 μm and a height of 15 μm. Subsequently, the two wafers, i.e., the SOI substrate and the substrate 9, are made to face each other such that the fixed supporting portions 4 and the connecting-portion-receiving portions 17 on the second layer 26 of the SOI substrate face the columnar connecting portions 10 on the substrate 9. Then, with reference to the reference marks on the second layer 26 and the reference marks provided on the substrate 9 for the bonding step, the two wafers are aligned such that the center of each of the connecting portions 10 and the center of a corresponding one of the connecting-portion-receiving portions 17 coincides with each other. The places of the connecting portions 10 and the connecting-portion-receiving portions 17 may be exchanged with each other. That is, one of the connecting portions 10 and the connecting-portion-receiving portions 17 may be formed at proper positions of the second layer 26, while the other may be formed at positions of the substrate 9 corresponding to the foregoing positions of the second layer 26.

Subsequently, the connecting portions 10 and the connecting-portion-receiving portions 17 are bonded to each other. In the second embodiment, after the completion of the alignment, the surfaces of the connecting portions 10 and the connecting-portion-receiving portions 17 are exposed to argon plasma for cleaning and activation thereof. In this step, impurities on the outermost surfaces are removed, whereby clean surfaces necessary for obtaining an appropriate bonding force are provided. Subsequently, the connecting portions 10 and the connecting-portion-receiving portions 17 are contact-bonded to each other at normal temperature. Herein, normal temperature refers to a temperature from about room temperature to about 100° C. In this contact-bonding step, the connecting portions 10 are compressed to about half the original height thereof, specifically, to 7 μm in the second embodiment. By the contact-bonding, the connecting portions 10 and the connecting-portion-receiving portions 17 are firmly bonded to each other, while a first gap 12 is provided between the second layer 26 and the fixed electrodes 8. The dimensions of the connecting-portion-receiving portions 17 and the fixed supporting portions 4 having the connecting-portion-receiving portions 17 thereon are set so as to be relatively large in accordance with the positional accuracy of the connecting portions 10, i.e., the alignment accuracy in the bonding step. Therefore, even if the alignment is imperfect, the connecting portions 10 and the connecting-portion-receiving portions 17 are assuredly bonded to each other.

Figure 2E:
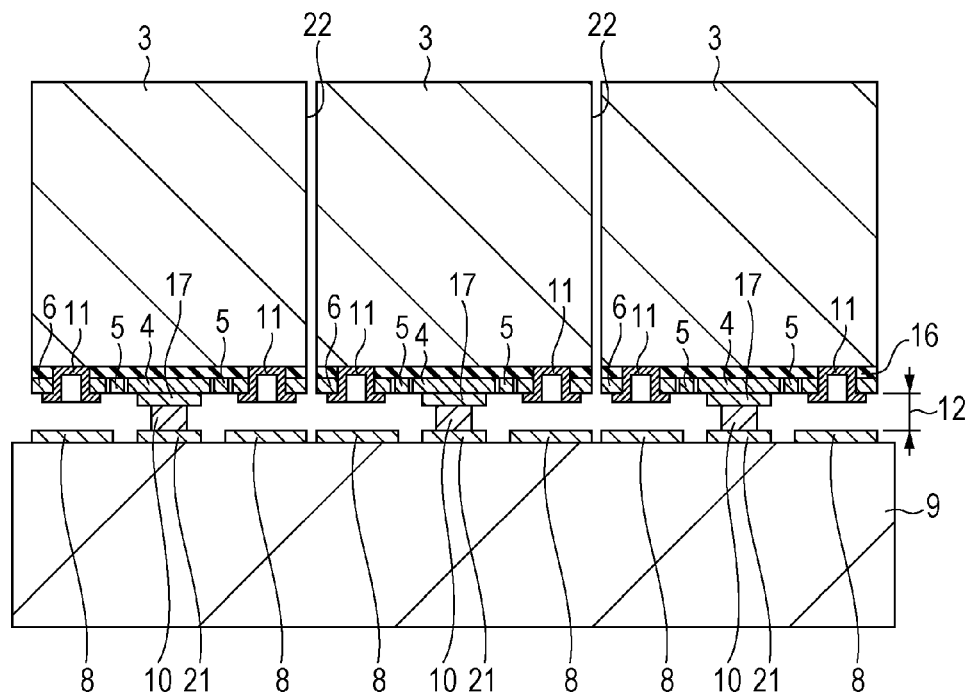

Referring now to FIG. 2E, separation is performed so as to obtain a plurality of microstructures. Specifically, a chromium film is deposited on the first layer 25 and is patterned into a hard mask by photolithography and etching (not shown). In this step, the hard mask is formed by aligning with reference to the reference marks provided on the substrate 9 for separation into microstructures in one of the preceding steps. Subsequently, silicon deep reactive-ion etching (DRIE) is performed on the first layer 25 with the hard mask, whereby separating grooves 22 are provided. Furthermore, the insulating layer 16 and the second layer 26 are sequentially dry-etched, whereby the separating grooves 22 are continued therethrough. Then, the hard mask is removed. In this step, second movable portions 3 and first movable portions 6 are obtained. The separating grooves 22 function as holes into which liquid or gas used for removing the insulating layer 16 in the subsequent step is to be introduced.

Figure 2F:
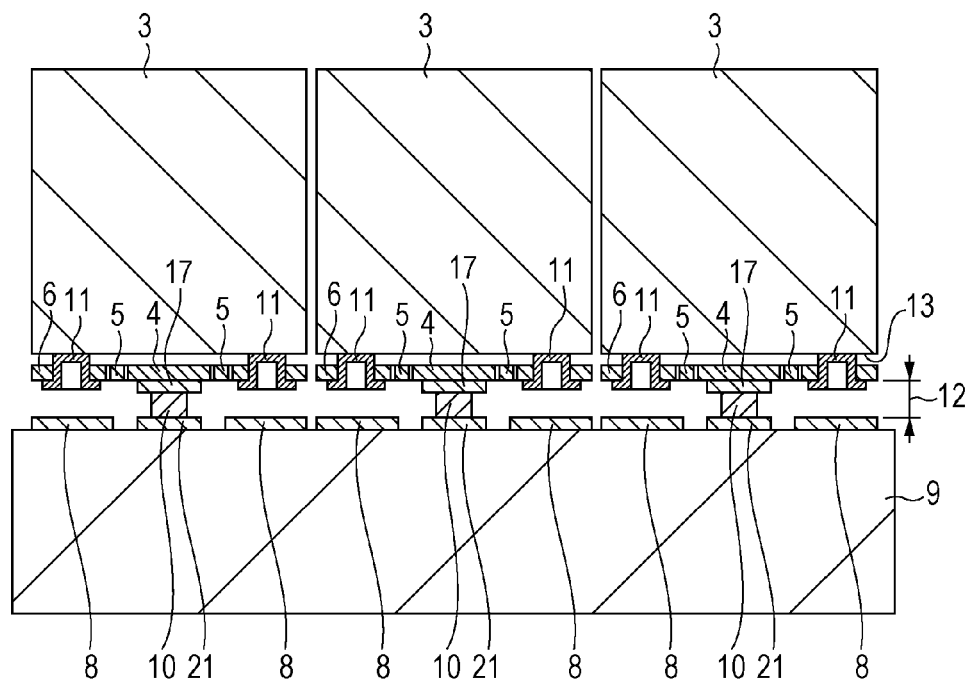

Lastly, referring to FIG. 2F, a second gap 13 is provided. Specifically, the insulating layer 16 is first removed by etching. Then, the resulting structure is dried. Thus, the second gap 13 is provided. In the second embodiment, after the insulating layer 16, which is a silicon dioxide film, is removed with buffered hydrogen fluoride, supercritical drying is performed with carbon dioxide.

The above manufacturing method according to the second embodiment provides the following benefits.

By the manufacturing method according to the second embodiment, the structure including two single-crystal-silicon layers between which the gap 13 is interposed is obtained in one bonding step. Compared with a case where the two layers are sequentially bonded, the occurrence of bonding failure is suppressed and the yield rate is correspondingly increased. Moreover, a reduced number of manufacturing steps contributes to low-cost manufacturing, and only one performance of alignment for bonding contributes to high-accuracy manufacturing. Meanwhile, by forming the first layer 25 and the second layer 26 of the SOI substrate into a set of second movable portions 3 and a set of first movable portions 6, respectively, of the microstructures, single-crystal-silicon layers that bear no residual stresses and have smooth surfaces with less crystal defects are obtained. The thickness, conductivity, crystal defects, and flatness of the second layer 26 of the SOI substrate are appropriately controlled. By forming the elastically deformable portions 5 in such a second layer 26, variations in the spring constant and in the probability of damage are reduced. Particularly, if the second layer 26 of the SOI substrate is as thin as about several microns or in submicron order, the elastically deformable portions 5 are provided with small spring constants that do not vary significantly. Furthermore, since the second movable portions 3 are formed in the first layer 25, structures as thick as about several tens to several hundreds of microns are obtained, whereby the second movable portions 3 have high rigidity. Thus, with the SOI substrate including the first layer 25 and the second layer 26 having different thicknesses, the microstructures are manufactured in a reduced number of bonding steps and with high accuracy.

Furthermore, since the coupling portions 11 are formed in the second layer 26, a high yield rate of the coupling portions 11 is realized. As described above, the second layer 26 is thinner than the first layer 25, and it is therefore possible to deposit the material for the coupling portions 11 continuously over the second layer 26 including the small side faces of the second layer 26. Furthermore, since the elastically deformable portions 5 are formed before the two substrates are bonded to each other, the elastically deformable portions 5 are fabricated with high accuracy, although being provided directly below the first layer 25 as the handle layer. Furthermore, since the contact areas are small, specifically, only the top surfaces of the connecting portions 10 in the form of bumps, bonding failure due to dust particles is hard to occur in the bonding step. Moreover, in the second embodiment where the connecting portions 10 are contact-bonded by being compressed, even if there are some particles of sizes equivalent to the length to be compressed, bonding is possible because such particles are taken into the compressed portions. Therefore, the probability of bonding failure is further reduced. Moreover, since the connecting portions 10 made of gold and the connecting-portion-receiving portions 17 having gold outermost surfaces are cleaned and activated with plasma and are then contact-bonded at normal temperature, there is no significant rise of temperature, and bonding is therefore performed stably. Consequently, there are substantially no differences in temperature and in length of expansion between the first substrate (SOI substrate) and the second substrate (substrate 9). Hence, structures formed on the two substrates are connected to each other while being positioned relative to each other with high accuracy. That is, the substrate 9 and the SOI substrate are bonded to each other with high alignment accuracy without undergoing thermal deformation. Even after the bonding of the first and second substrates, the substrates undergo substantially no warpage. The structures are bonded and electrically connected to each other without the use of fluid adhesive such as solder or paste while a high bonding strength and a specific gap are maintained. Therefore, the positions and areas of fixation are set accurately. Thus, even in the case where a plurality of microstructures are provided on a single wafer, the probability of bonding failure is reduced.

Meanwhile, since the separating grooves 22 are provided in the SOI substrate after the bonding, the hard mask is aligned with reference to the reference marks provided on the substrate 9. Hence, the second movable portions 3 and the first movable portions 6 are aligned with the fixed electrodes 8, regardless of the alignment accuracy in the bonding step. Therefore, the positional accuracy of the second movable portions 3 and the first movable portions 6 with respect to the fixed electrodes 8 is improved. Although the rigidity of the SOI substrate is reduced by providing the separating grooves 22, since the separating step is performed in the latter part of the entire manufacturing process, the yield rate is increased. In the bonding step in which the largest stress is applied to the substrates, the SOI substrate is still highly rigid. Therefore, deformation of the SOI substrate during the bonding step is reduced. Consequently, the microstructures are manufactured with high accuracy. In particular, the gap 12 between the SOI substrate, as the first substrate, and the substrate 9, as the second substrate, is provided with high accuracy.

Since the insulating layer 16 provided between the first layer 25 and the second layer 26 is removed in the last step, the elastically deformable portions 5 are kept supported by the insulating layer 16 all through the manufacturing process. This increases the yield rate of the elastically deformable portions 5 that may be damaged during the manufacturing process because of its easiness to undergo displacement in the designed direction.

Unlike in the bonding step according to the second embodiment, a plurality of microstructures according to the first embodiment of the present invention may alternatively be manufactured by the following bonding process. In the step shown in FIG. 2D where the connecting portions 10 and the connecting-portion-receiving portions 17 are bonded to each other, the connecting portions 10 may be solder bumps and the connecting-portion-receiving portions 17 may be made of gold. In such a bonding step, the solder is melted by raising the temperature and then the temperature is lowered to the normal level so that the molten solder is hardened, whereby the bonding is completed. As another alternative, the connecting portions 10 may be copper bumps having a silver-tin film at the tops thereof and the connecting-portion-receiving portions 17 may be made of gold. In such a case, bonding is performed by raising the temperature and applying a pressure.

As yet another alternative, bonding may be performed by forming a spacer layer that fills the first gap 12 so as to determine the length of the first gap 12. The spacer layer may be formed on either of the substrate 9 and the second layer 26. For example, after the completion of the step shown in FIG. 2C, a polyimide film is provided. Subsequently, the surface of the polyimide film is smoothed by CMP, and through-holes are provided in the polyimide film by dry etching in such a manner as to expose the connecting-portion-receiving portions 17. The polyimide film thus formed is made to function as the spacer layer. By utilizing the polyimide film having a specific thickness, the accuracy in the length of the first gap 12 defined in the bonding step shown in FIG. 2D is improved.

More specific examples will now be described.

Example 1

Figure 3A:
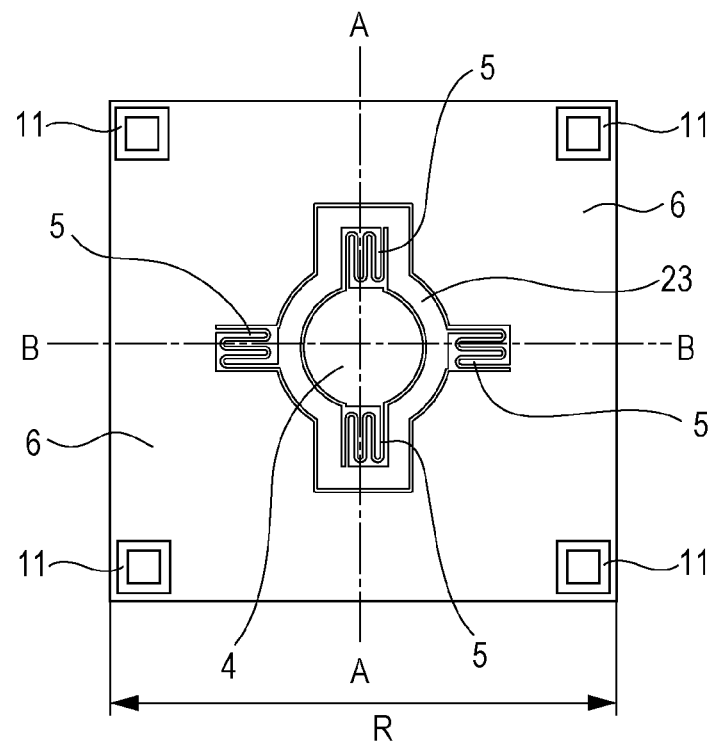
FIGS. 3A to 3D explain an example of the microstructure according to the present invention and a microstructure array.
Figure 3B:
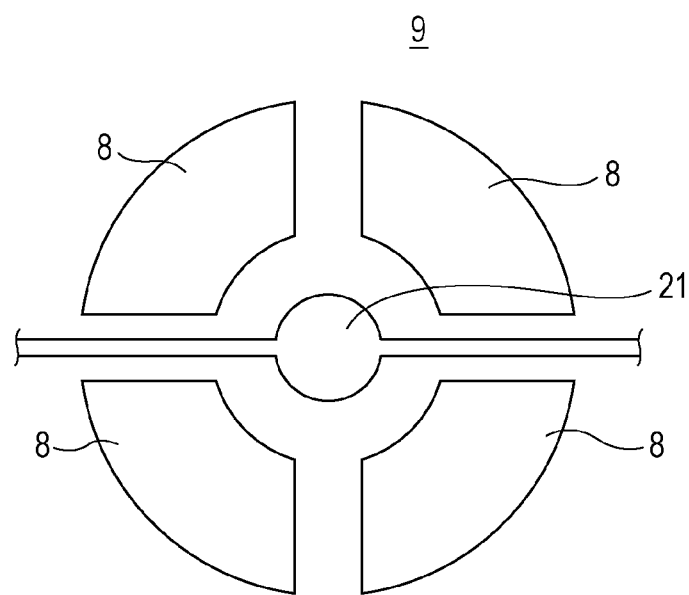
Figure 3C:
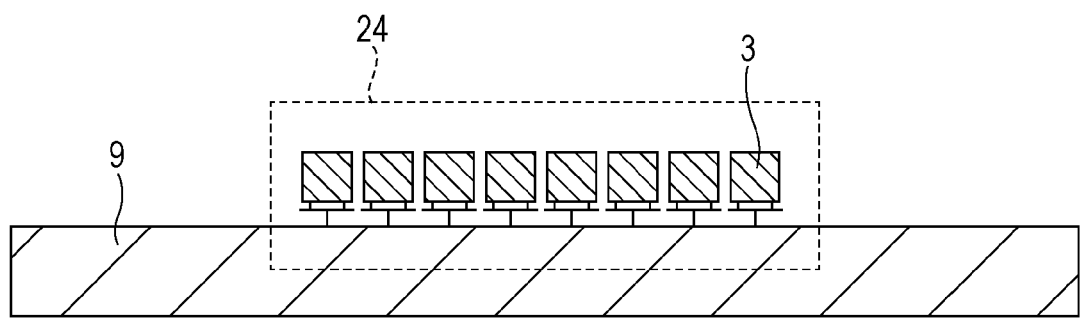
Figure 3D:
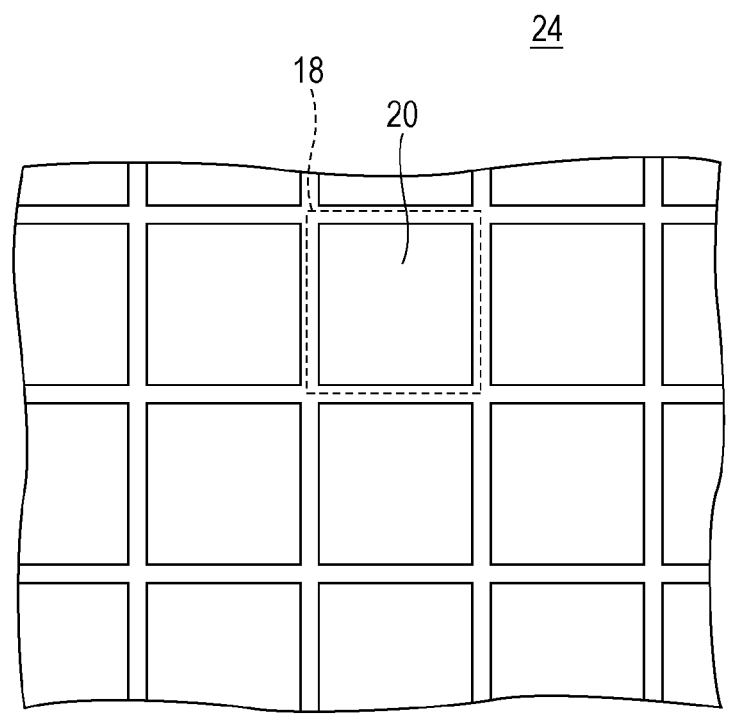

Referring to FIGS. 3A to 3D, Example 1 of the present invention will be described. FIG. 3A is a top view of a structure including a first movable portion 6 of a microstructure according to Example 1. FIG. 3B is a top view of fixed electrodes 8 provided on a substrate 9. FIG. 3C is a sectional side view of a microstructure array 24. FIG. 3D is a top view of the microstructure array 24 including a plurality of microstructures 18. Elements equivalent to those described in the above embodiments are denoted by the same reference numerals as those used in the embodiments, and detailed descriptions thereof are omitted.

In Example 1, as shown in FIG. 3A, the first movable portion 6 surrounds one fixed supporting portion 4 provided in the center and is elastically supported by two pairs of elastically deformable portions 5 capable of undergoing torsional displacement. The two pairs of elastically deformable portions 5 are provided around the fixed supporting portion 4 and are connected to each other with an elastically deformable frame-like interconnecting portion 23. The two pairs of elastically deformable portions 5 and the frame-like interconnecting portion 23 in combination form an elastic supporting portion. With the elastic supporting portion, the first movable portion 6 and the second movable portion 3 secured to the first movable portion 6 are capable of two-dimensionally undergoing torsional displacement about two axes represented by lines A-A and B-B that are orthogonal to each other. In Example 1, the two pairs of torsion springs, i.e., the elastically deformable portions 5, each have a meandering structure as shown in FIG. 3A.

Referring to FIG. 3B, there are provided four fixed electrodes 8 each having a sector shape. An underlayer 21 provided in the center is provided with electrode extracting wires for forming a connecting portion 10. The wires are formed by electroplating. In Example 1, referring to FIG. 3C, a plurality of microstructures 18 are provided on one substrate 9, whereby the microstructure array 24 is formed. The substrate 9 has the fixed electrodes 8 provided for each of the microstructures 18. The substrate 9 is in advance provided with a drive circuit including a semiconductor integrated circuit and is capable of controlling the voltages to be applied to the electrodes 8 of the individual microstructures 18. Thus, capacitors formed at the first gaps 12 of the microstructures 18 function as electrostatic actuators in which the second movable portions 3 coupled to the respective first movable portions 6 with coupling portions 11 are capable of two-dimensionally undergoing torsional displacement. Referring to FIG. 3D, the outermost surfaces of the second movable portions 3 are covered with highly reflective aluminum films functioning as reflective surfaces 20, whereby the microstructures 18 function as optical deflectors (mirror pixels).

For each of the microstructures 18 that is of side R 64 µm, the second movable portion 3 has thickness 2 (see FIG. 1A) of 50 µm; the first movable portion 6 has thickness 1 (see FIG. 1A) of 1.6 µm; the connecting portion 10 has a round columnar shape with a diameter of 10 µm; the fixed supporting portion 4 has a diameter of 15 µm; and the interconnecting portion 23 has a width of 3 µm. The gap between adjacent ones of the mirror pixels is 5 µm. For each of the mirror pixels, gaps that separate the fixed supporting portion 4, the elastically deformable portions 5, and the interconnecting portion 23 from one another are 0.5 µm; the meandering torsion springs of the elastically deformable portions 5 each have, in each linear segment of folded sections thereof, a width of 0.5 µm and a length of 5 µm, the width being in the direction perpendicular to a corresponding one of the axes of torsion; and the gap 12 provided between the first movable portion 6 and the fixed electrodes 8 is 4 µm.

The microstructure array (mirror array) 24 includes 32-by-32 microstructures 18, a total of 1024 microstructures 18 (in FIG. 3C, the number of microstructures 18 are significantly reduced so that the microstructures 18 are recognizable). By placing a voltage of 40 V at maximum on the four fixed electrodes 8, the first movable portion 6 and the second movable portion 3 of each of the microstructures 18 are two-dimensionally displaced and thus deflect light, independent of those of the other microstructures 18, at a displacement angle of ±1 degree at most. When light is applied to the microstructure array 24, the microstructure array 24 can function as a spatial light-intensity modulator or a phase modulator. Such a mirror array can be used in maskless exposure or the like. The microstructures 18 according to Example 1 also provide the similar benefits that are brought by the above embodiments. In particular, the microstructure array 24 functioning as an optical deflector array having the reflective surfaces 20 on the respective second movable portions 3 provides the following benefits.

Since the occurrence of unintentional deformation is suppressed, each of the reflective surfaces 20 is very flat, and an optical device exhibiting a good catoptric characteristic is realized. Furthermore, since each of the second movable portions 3 is highly rigid with a thickness of, for example, 50 µm, the reflective surface 20 thereof is made flat even if the aluminum film forming the reflective surface 20 is replaced with a dielectric multilayer film. This is because the second movable portion 3 is so rigid that the amount of any deformation thereof caused by a stress applied from the dielectric multilayer film does not become large. Thus, a high reflectivity is realized. The flat reflective surface 20 is also obtained by forming a protective film that prevents the deterioration of the reflective surface 20 due to high-power light or ultraviolet rays such as excimer laser beams having short wavelengths.

Since the fixed supporting portion 4, the elastically deformable portions 5, the first movable portion 6, and the fixed electrodes 8 of each microstructure 18 are provided directly below the second movable portion 3, the foregoing structures are hidden as shown in FIG. 3D when seen from the side from which light is applied. Therefore, the foregoing structures are prevented from being damaged or deteriorated by light applied thereto. Moreover, rises of temperatures of the foregoing structures due to absorption of light are suppressed, realizing a light modulator or the like capable of stably modulating high-power light with high reliability.

Furthermore, since the second movable portion 3 provided above the first movable portion 6 has the reflective surface 20, the proportion of the reflective area in the entirety of the microstructure 18 is large, realizing a microstructure having high reflection efficiency. Furthermore, since the microstructure 18 is highly rigid, the reflective surface 20 thereof does not bend significantly even if any stress occurs in the material or film of the reflective surface 20. Therefore, as described above, in spite of being such a very small optical device in, for example, micrometer order, the microstructure 18 can employ a light-protective structure, a dielectric multilayer film, or the like as the reflective surface 20 thereof. Accordingly, a highly reflective surface whose reflectivity is not deteriorated significantly is realized. Furthermore, since the displacement stability of the elastic supporting portions is high, the stability in retaining the displacement of the reflective surface 20 is improved. This enables an operation of deflecting light in one specific direction. Furthermore, since the repeatability of displacement of the reflective surface 20 is high, highly accurate light deflection/modulation is possible. In the case where a plurality of microstructures 18 are provided in the form of an array, variations in the displacement of different reflective surfaces 20 provided in the array are reduced. Furthermore, change of the voltage/displacement characteristic of each microstructure 18 during the period of use is suppressed. Furthermore, since the microstructure 18 is highly rigid, unintentional deformation of the reflective surface 20 thereof due to the generative force of the actuator is reduced.

Example 2

Figure 4A:
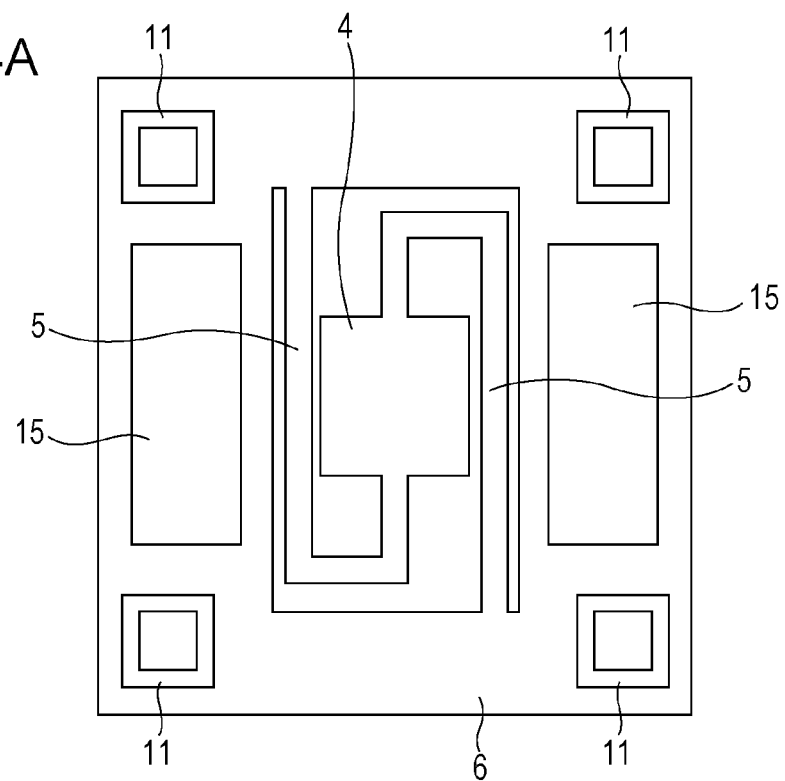
FIGS. 4A to 4D explain another example of the microstructure according to the present invention.
Figure 4B:
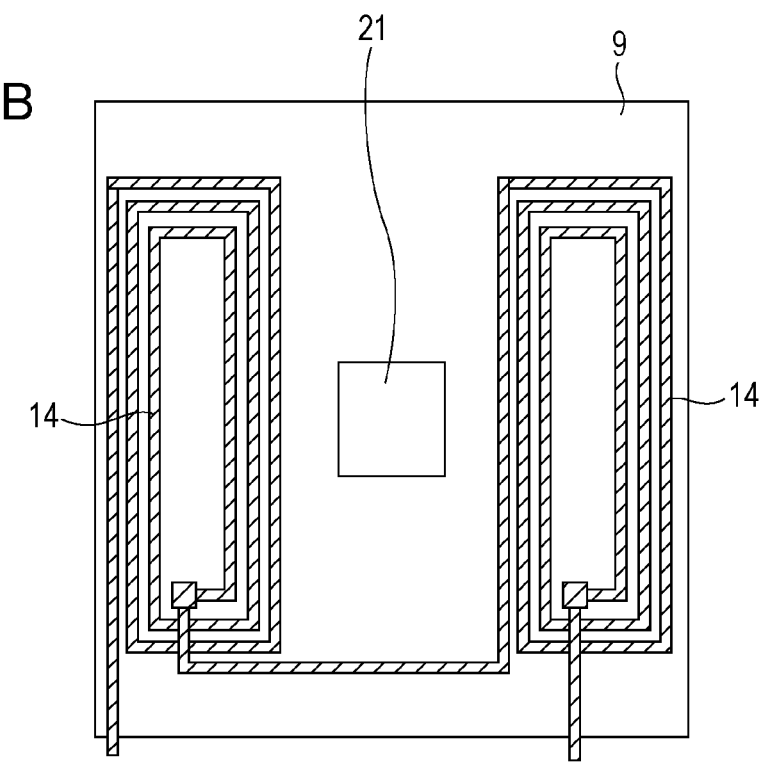
Figure 4C:
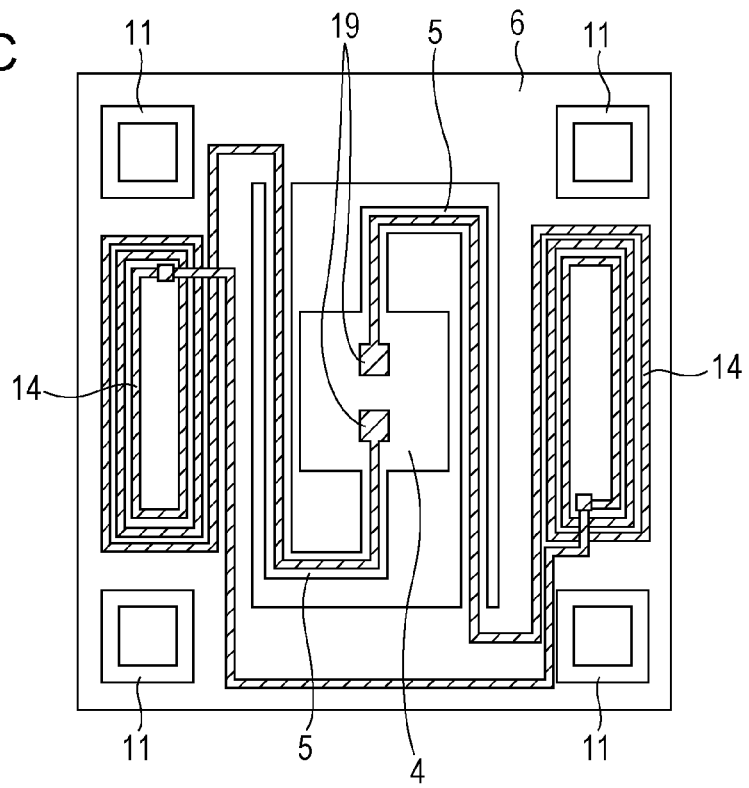
Figure 4D:
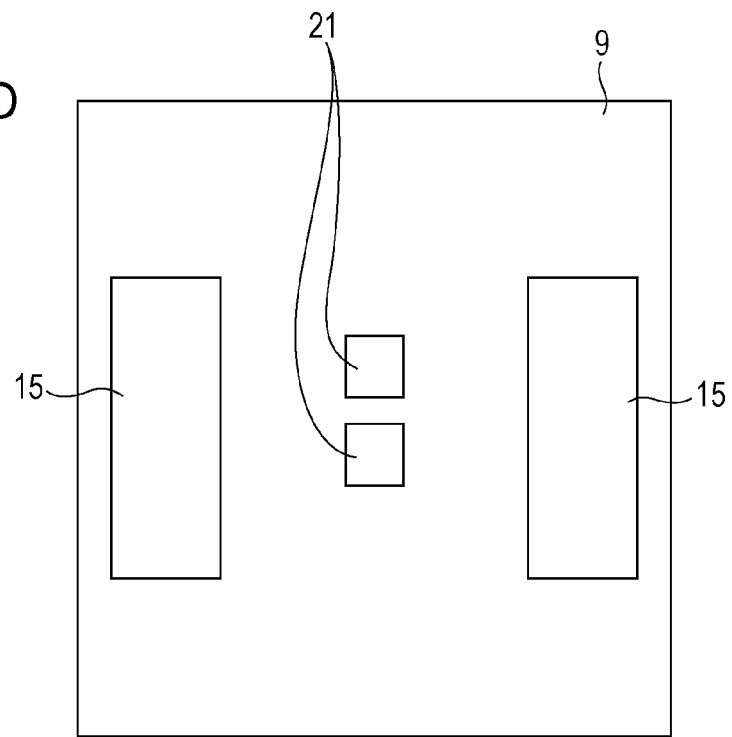

Referring to FIGS. 4A to 4D, Example 2 of the present invention will now be described. FIGS. 4A and 4C are top views of microstructures according to Example 2 and a variation thereof, respectively, showing structures including respective first movable portions 6. FIGS. 4B and 4D are top views of substrates 9 according to Example 2 and the variation thereof, respectively. Elements equivalent to those described in the above embodiments and Example 1 are denoted by the same reference numerals as those used in the embodiments and Example 1, and detailed descriptions thereof are omitted.

Example 2 differs from Example 1 in that the first movable portion 6 and the substrate 9 have a coil 14 and magnetic bodies 15, whereby the first movable portion 6 is driven by an electromagnetic force. In the configuration shown in FIGS. 4A and 4B, the first movable portion 6 has the magnetic bodies 15, and the substrate 9 has the coil 14. In the variation shown in FIGS. 4C and 4D, the first movable portion 6 has the coil 14, and the substrate 9 has the magnetic bodies 15. The coil 14 and connecting wires provided thereto are insulated from portions on which they are provided. When electricity is supplied to the coil 14, an electromagnetic force is generated between the coil 14 and the magnetic bodies 15, whereby the first movable portion 6 is driven. In FIG. 4C, the coil 14 has on both ends thereof extraction electrodes 19. The extraction electrodes 19 are provided on the fixed supporting portion 4. Two connecting-portion-receiving portions 17 are provided on the two extraction electrodes 19, respectively, and are connected to the substrate 9 with two connecting portions 10 and two underlayers 21 interposed therebetween, as shown in the drawings.

As shown in FIGS. 4A and 4C, the elastically deformable portions 5 have the same shape as those in the first embodiment shown in FIGS. 1A to 1D. The microstructure according to Example 2 is obtained by providing the coil 14 and the magnetic bodies 15 to the microstructure shown in FIGS. 1A to 1D, excluding the fixed electrodes 8. As in Example 1, the microstructure according to Example 2 also has a light-reflective surface on the second movable portion 3, and the reflective surface is displaceable in direction F shown in FIG. 1A by the electromagnetic force. The magnetic bodies 15 in Example 2 are formed of electroplated nickel. The coil 14 is formed of electroplated copper. The microstructure according to Example 2 including the magnetic bodies 15 and the coil 14 and thus generating an electromagnetic force functions as an actuator that operates with a large stroke and generates a large force. Since errors in the displacement of the reflective surface do not include any effect of charging of the insulating elements provided therearound, the reflective surface, i.e., a mirror, is driven with high accuracy. The other features are the same as those in Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-058726 filed Mar. 16, 2010, which is hereby incorporated by reference herein in its entirety.

What is claimed is:

1. A microstructure comprising:
   a substrate;
   a fixed supporting portion fixed to the substrate;
   a first movable portion; and
   an elastic supporting portion in direct contact with the first movable portion and the fixed support portion and elastically interconnecting the first movable portion and the fixed supporting portion; and
   a second movable portion being secured to the first movable portion and enhancing the rigidity of the first movable portion;
   wherein the first movable portion has a frame-like shape surrounding the elastic supporting portion and the fixed supporting portion, and
   the second movable portion is secured to the first movable portion with a gap interposed therebetween.

2. The microstructure according to claim 1,
   wherein the elastic supporting portion includes an elastically deformable interconnecting portion, a first torsion spring, and a second torsion spring, the connecting portion having a frame-like shape surrounding the fixed supporting portion,
   wherein the first torsion spring supports the interconnecting portion such that the interconnecting portion is capable of undergoing torsional displacement about a first axis of torsion relative to the fixed supporting portion, and
   wherein the second torsion spring supports the first movable portion such that the first movable portion is capable of undergoing torsional displacement about a second axis of torsion relative to the interconnecting portion.

3. The microstructure according to claim 1,
   wherein the elastic supporting portion includes an elastically deformable interconnecting portion, a first torsion spring, and a second torsion spring, the connecting portion having a frame-like shape surrounding the fixed supporting portion,
   wherein the first torsion spring supports the interconnecting portion such that the interconnecting portion is capable of undergoing torsional displacement about a first axis of torsion relative to the fixed supporting portion, and
   wherein the second torsion spring supports the first movable portion such that the first movable portion is capable of undergoing torsional displacement about a second axis of torsion relative to the interconnecting portion.

4. The microstructure according to claim 1, wherein the first movable portion and the second movable portion are driven together by an electrostatic force or an electromagnetic force acting between the substrate and a surface of the first movable portion that faces the substrate.

5. The microstructure according to claim 4,
   wherein the second movable portion has a light-reflective surface, and
   wherein the light-reflective surface is driven.

6. The microstructure according to claim 1, wherein the second movable portion is thicker than the first movable portion.

7. The microstructure according to claim 1, wherein the first movable portion and the elastic supporting portion have the same thickness.

8. The microstructure according to claim 1, wherein the first moveable portion and the second moveable portion are made of single-crystal silicon.

9. The microstructure according to claim 1, wherein the first movable portion, the elastic supporting portion and the fixed supporting portion are of the same material.

10. The microstructure according to claim 9, wherein the second movable portion is of the same material of the first movable portion.

11. A microstructure, comprising:
    a substrate;

a fixed supporting portion extending on a plane and fixed to the substrate;

a first movable portion extending on the plane; and an elastic supporting portion extending from the first movable portion to the fixed support portion and elastically interconnecting the first movable portion and the fixed supporting portion on the plane, and the first movable portion has a frame-like structure surrounding the elastic supporting portion and the fixed supporting portion on the plane; and a second movable portion being secured to the first movable portion, wherein the first movable portion is configured to move out of the plane by deformation of the elastic supporting portion.

12. The microstructure of claim 10, wherein the first movable portion, the fixed supporting portion, and the elastic supporting portion are of the same material.

13. The microstructure according to claim 12, wherein the second movable portion is of the same material as the first movable portion.

* * * * *